US008619430B2

(12) United States Patent
Kynast et al.

(10) Patent No.: US 8,619,430 B2
(45) Date of Patent: Dec. 31, 2013

(54) SWITCH/CIRCUIT BOARD UNIT FOR INSTALLATION IN A HANDLE OF A HAND-HELD TOOL

(75) Inventors: Andreas Kynast, Stuttgart (DE); Markus Schmid, Wolfschulgen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/883,661

(22) Filed: Sep. 16, 2010

(65) Prior Publication Data

US 2011/0063817 A1 Mar. 17, 2011

(30) Foreign Application Priority Data

Sep. 16, 2009 (DE) ........................ 10 2009 029 506

(51) Int. Cl.
*H05K 5/00* (2006.01)

(52) U.S. Cl.
USPC ........... 361/758; 361/807; 361/781; 361/809; 361/810

(58) Field of Classification Search
USPC ......... 361/729, 825, 826, 807–810, 742, 758, 361/770, 781; 200/522
See application file for complete search history.

(56) References Cited

U.S. PATENT DOCUMENTS

| | | | | |
|---|---|---|---|---|
| 3,761,774 | A * | 9/1973 | Laughinghouse et al. | 361/45 |
| 4,316,067 | A * | 2/1982 | Whiteman, Jr. | 200/325 |
| 4,349,861 | A * | 9/1982 | Zizza | 361/628 |
| 4,581,499 | A * | 4/1986 | Cousins | 200/1 V |
| 5,598,082 | A * | 1/1997 | Gilpin et al. | 200/293.1 |
| 7,134,364 | B2 * | 11/2006 | Kageler et al. | 81/52 |
| 2004/0196607 | A1 * | 10/2004 | Didier | 361/104 |
| 2004/0196637 | A1 * | 10/2004 | Le et al. | 361/758 |
| 2005/0174748 | A1 * | 8/2005 | Kojima | 361/796 |
| 2007/0188984 | A1 * | 8/2007 | Opsitos, Jr. | 361/600 |
| 2008/0245876 | A1 * | 10/2008 | Gordon et al. | 235/490 |
| 2009/0014210 | A1 * | 1/2009 | Forbis | 174/480 |

FOREIGN PATENT DOCUMENTS

| | | | | |
|---|---|---|---|---|
| DE | 2824384 | A1 | 12/1979 | |
| DE | 3606926 | A1 | 10/1987 | |
| DE | 102007037125 | A1 | 4/2008 | |
| JP | 04317396 | A * | 11/1992 | H05K 7/00 |
| JP | 2008073779 | A | 4/2008 | |

* cited by examiner

*Primary Examiner* — Tuan T Dinh
*Assistant Examiner* — Steven Sawyer
(74) *Attorney, Agent, or Firm* — Kenyon & Kenyon LLP

(57) ABSTRACT

A switch/circuit board unit and a hand-held tool equipped with such a switch/circuit board unit are proposed. The switch/circuit board unit is adapted for installation in a handle of the tool and has a switch and a circuit board. The switch/circuit board unit also has a mechanical coupling element for producing a rigid mechanical coupling between the switch and circuit board. The rigid coupling that the coupling element produces between the switch and circuit board allows the arrangement of the switch and circuit board to be embodied as a unit, which can enable maneuvering before installation and permit a simplified installation, and in particular, it is possible to simplify a fastening of the switch and circuit board inside a housing of the tool, and in the accompanying installation of electrical connections, for example in the form of flexible cables, it is possible to avoid an incorrect placement or wedging of cables.

33 Claims, 9 Drawing Sheets

SWITCH/CIRCUIT BOARD UNIT FOR INSTALLATION IN A HANDLE OF A HAND-HELD TOOL

CROSS-REFERENCE TO RELATED APPLICATION

This application is based on German Patent Application 10 2009 029 506.2 filed Sep. 16, 2009.

BACKGROUND OF THE INVENTION

1. Field of the Invention

The invention relates to a switch/circuit board arrangement that is designed for installation in a handle of a hand-held tool. The invention also relates to a hand-held tool that is equipped with such a switch/circuit board arrangement.

2. Description of the Prior Art

In hand-held tools such as drills, cordless screwdrivers, or the like, functions such as the rotation speed of a tool head are frequently controlled by means of a switch that can be actuated by a user. In this case, the switch can be embodied as a simple on-off switch, a switch with several switching stages, a switch that can be actuated continuously across a switching spectrum, or a switch with a speed-adjustment function. Customarily, the switch is affixed to a housing of the tool and electrically connected to a circuit board by means of cables; for example, the circuit board can convert a signal received from the switch into control signals for a motor. The circuit board in this case is itself likewise fastened to the housing of the tool. Separate securing ribs are provided for respectively fastening the switch and the circuit board in the tool housing.

It has become apparent that installing the switch and the circuit board in the housing of the tool can require a considerable amount of effort. In addition, particularly in mass production of tools, it has turned out that problems can arise when maneuvering the switch and the circuit board, both before and during installation in the housing.

OBJECT AND SUMMARY OF THE INVENTION

The object of the present invention is to disclose a switch/circuit board arrangement for installation in a handle of a hand-held tool and to disclose a correspondingly equipped tool in which a special embodiment of the switch/circuit board arrangement can facilitate maneuvering before and during installation in the handle.

The present invention proposes a switch/circuit board unit, which, in addition to a switch and a circuit board, also has at least one mechanical coupling element. The mechanical coupling element in this case is designed for producing a rigidly mechanical coupling between the switch and the circuit board.

A core concept of the invention can be viewed as based on the following discovery and idea:

It has been discovered that in conventional switch/circuit board arrangements, both before and during their installation, problems can arise due to the fact that the switch and the circuit board are not attached to each other in a rigidly mechanical fashion before being installed into the tool housing. For example, it has been necessary up to now to continuously readjust a position and orientation of the two components relative to each other during installation in the tool housing. In this case, the flexible cables loosely extending between the switch and the circuit board sometimes made it difficult to maneuver the switch/circuit board arrangement as a whole. In particular, cables have gotten caught or in the worst case, become wedged and therefore damaged during installation in the housing. After installation, all cables had to be inspected for correct positioning. Due to hidden installation and possible readjustment, it was not always possible to rule out incorrect positioning of the cables and damage to their insulation. In addition, it was necessary for both the switch and the circuit board, as two separate components, to each be mechanically connected to respective ribs that had to be provided on the tool housing.

The present invention now proposes embodying the switch/circuit board arrangement as a unit in which the switch and circuit board are coupled to each other in a rigidly mechanical fashion by means of a coupling element. In this context, the expression "rigidly mechanical" can mean that the coupling element is intrinsically stable enough and connected to the switch and circuit board firmly enough that with normal maneuvering during installation, no relative movement occurs between the switch and the circuit board. Providing them in the form of a mechanically stable unit can improve installability, prevent installation errors, and reduce installation time, which can be accompanied by lower installation costs and also lower potential repair costs.

The coupling element can be provided in the form of at least one separate component that is fastened to the switch and circuit board in a form-locked or integrally joined fashion. For example, the coupling element can be embodied as a separate component that is positioned between the switch and the circuit board and mechanically connected to both the switch and the circuit board at one or more points. Alternatively, the coupling element can have a plurality of separate components such as a plurality of spacer bolts connected to both the switch and the circuit board. A form-locked fastening can be achieved, for example, by means of cold caulking, hot caulking, detent engagement, and/or hook engagement. An integrally joined fastening can be achieved for example by means of gluing or ultrasonic welding.

Alternatively, the coupling element can be embodied of one piece with the switch, in particular with the housing of the switch, or can be embodied of one piece with the circuit board. For example, spacer bolts serving as coupling elements can be extrusion-mounted onto a plastic housing of the switch and an opposite end of the coupling element can in turn be connected to the circuit board in a form-locked or integrally joined fashion.

The switch/circuit board unit can be equipped with at least one flexible cable, preferably a plurality of flexible cables, for a producing the electrical connection between the switch and the circuit board. In this case, it can be advantageous to provide at least one cable support that is embodied to secure at least one cable, i.e. to immobilize it in its position relative to the switch and the circuit board. The cable support in this case can be situated on the switch and/or on the coupling element. The cable support can improve cable routing inside the tool and can help avoid installation errors. For example, the cable support can protrude in a stirrup shape from the switch or coupling element so that cables can be secured and preferably clamped inside the bracket. Preferably, the cable support can be opened and closed in a simple fashion to permit initial insertion of cables, subsequent addition of cables, or removal of cables.

The switch/circuit board unit can also be equipped with an electrical connecting element for producing a mechanically rigid electrical connection between the switch and circuit board. This embodiment can be viewed as an alternative to the above-described electrical connection between the switch and circuit board with the aid of flexible cables. By contrast with the flexible cables, the electrical connecting element should enable a mechanically rigid connection between the switch and circuit board that simultaneously produces an electrical connection. In this case, the electrical connecting element can be provided in addition to the mechanical coupling element. Alternatively, the mechanical coupling element and electrical connecting element can be integrated into a single component.

For example, the electrical connecting element can be embodied in the form of a stamped and bent part. As such, it can be manufactured and installed in a fully automated fashion, for example using a plug-in technique and if need be through the use of simple soldering points, without requiring adjustment or other aids.

The electrical connecting element can be attached to the switch and/or circuit board in a form-locked or integrally joined fashion. For example, a form-locked attachment can be produced by means of caulking, pinning, screw-mounting, and/or by using a press-fitting technique. An integrally joined connection can be achieved, for example, by means of soldering and/or gluing.

In order to permit a hand-held tool to have an ergonomic shape of a handle despite the installation of a customarily block-shaped switch in the tool housing, the switch provided in the switch/circuit board unit can have a housing whose geometry is adapted to an ergonomic shape of the handle by deviating from the block shape. The deviations from the block shape can, for example, include rounding or beveling of edges of the block.

The above-described switch/circuit board unit can be used to embody a hand-held tool that has a housing in which it is possible to install the switch/circuit board unit by fastening only one of the two components, i.e. either the switch or the circuit board, directly to the housing. The other component is connected in a mechanically rigid fashion to the component fastened to the housing and is thus also secured indirectly to the housing. It is therefore only necessary to equip the tool housing with one set of fastening ribs, by contrast with conventional tools in which it was necessary to provide two sets of ribs, one for the switch and one for the circuit board.

The invention will be better understood and further objects and advantages thereof will become more apparent from the ensuing detailed description of preferred embodiments taken in conjunction with the drawings.

BRIEF DESCRIPTION OF THE DRAWINGS

Exemplary embodiments of the invention and aspects contained therein will be described below with reference to the figures, in which.

DESCRIPTION OF THE PREFERRED EMBODIMENTS

Figure 1:
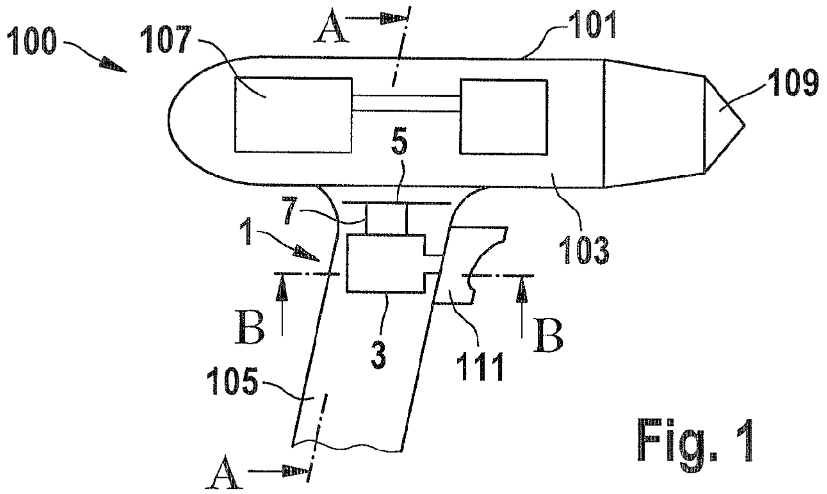
FIG. 1 is a side view of a hand-held tool equipped with a switch/circuit board unit according to an embodiment of the present invention.

FIG. 1 shows a hand-held tool 100 according to the invention, embodied in the form of a cordless screwdriver. The tool 100 has a housing 101 that has a main body 103 and a handle 105. The main body 103 contains, among other things, a motor 107 that is able to drive a working head 109. A switch 3 is integrated into the handle 105 and can be actuated by a user by means of a trigger 111. The switch 3 is connected in a mechanically rigid fashion to a circuit board 5 by means of coupling elements 7 and in this way, constitutes a switch/circuit board unit 1. In this case, both the handle 105 and the trigger 111 are ergonomically shaped to permit comfortable operation of the tool 100 by the user.

Figure 2:
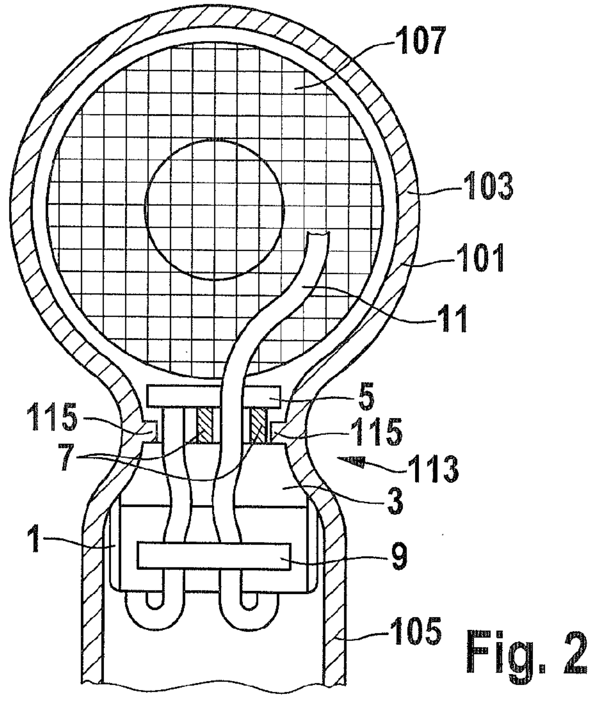
FIG. 2 shows a section through the tool from FIG. 1 along the plane A-A.

As depicted in FIG. 2 in a section along the plane A-A indicated in FIG. 1, the cylindrical motor 107 is fitted into the main body 103 of the housing and the switch/circuit board unit 1 is fitted into the ergonomically shaped handle 105. In this case, the switch 3 is situated in an upper part of the handle, which is adapted in its contour and diameter to allow for advantageous ergonomics, and the circuit board 5 is situated in a tapered transition 113 between the handle 105 and the main body 103. A fastening rib 115 to which the switch 3 and thus the entire switch/circuit board unit 1 can be fastened is provided in the tapered transition 113. Cables 11 extending between the switch 3 and circuit board 5 are secured by a cable support 9.

Figure 3:
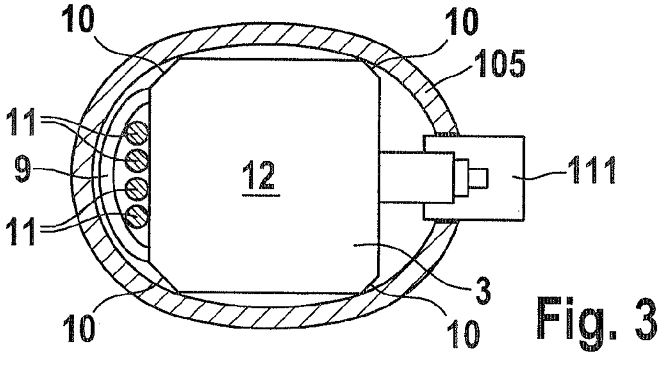
FIG. 3 shows a section through the tool from FIG. 1 along the plane B-B.

As is particularly clear in FIG. 3, the otherwise block-shaped housing 12 of the switch 3 is adapted to the ergonomic shape of the handle 105 by means of bevels 10. The cable support 9 that secures the cables 11 is likewise embodied so that it fits into the ergonomic shape of the handle 105.

In conjunction with FIGS. 4 through 14, the following description will explain various connecting techniques that can be used in the exemplary embodiments of the switch/circuit board unit 1 to produce a rigidly mechanical connection between the switch 3 and the circuit board 5 by means of a coupling element 7.

Figure 4:
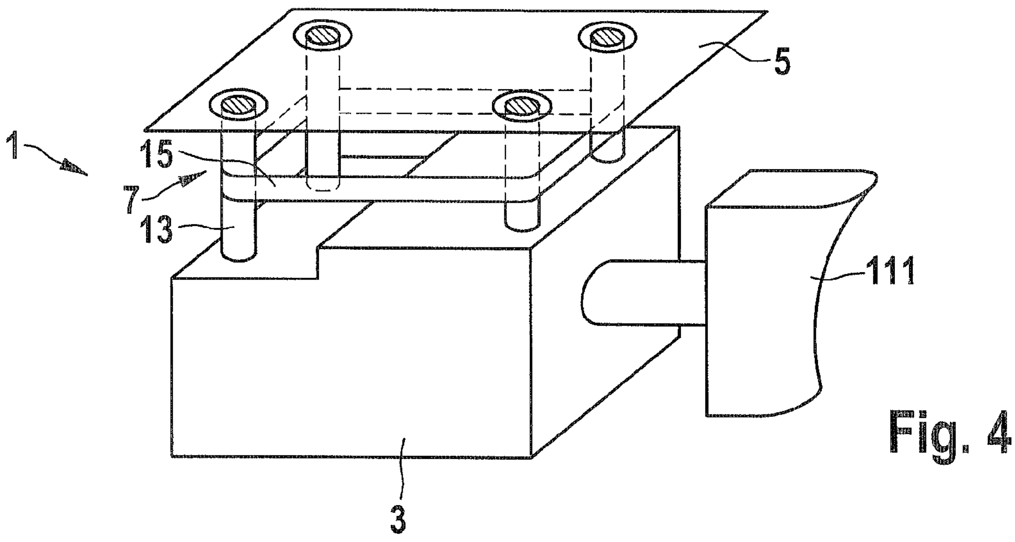
FIG. 4 is a perspective view of a switch/circuit board unit according to an embodiment of the present invention.

As shown in FIG. 4, the coupling element 7 can be embodied in the form of spacer bolts 13, i.e. four spacer bolts in the example shown, and a set of struts 15 that connect the spacer bolts 13 firmly to one another. The coupling element 7 is therefore embodied in the form of a fixed grid. A cable support 9 (not shown in FIG. 4 for the sake of clarity) can be provided on the struts 15 in order to affix cables or lines between the switch 3 and the circuit board 5.

Figure 5:
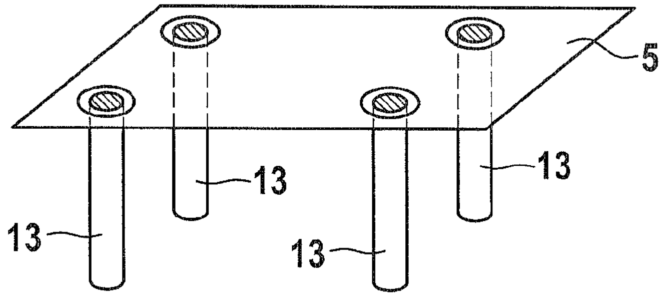
FIGS. 5-14 show possible embodiments of coupling elements for switch/circuit board units according to embodiments of the present invention.

In lieu of the spacer bolts 13 that are connected to each other by means of the struts 15 and therefore form a grid, as shown in FIG. 5.

It is also possible for individual spacer bolts 13 or pins to serve as a coupling element 7. The spacer bolts 13 can be inserted into bores provided in either the circuit board 5 or the switch 3 and mechanically fastened by means of generally known methods such as cold caulking, hot caulking, or ultrasonic welding.

Figure 6:
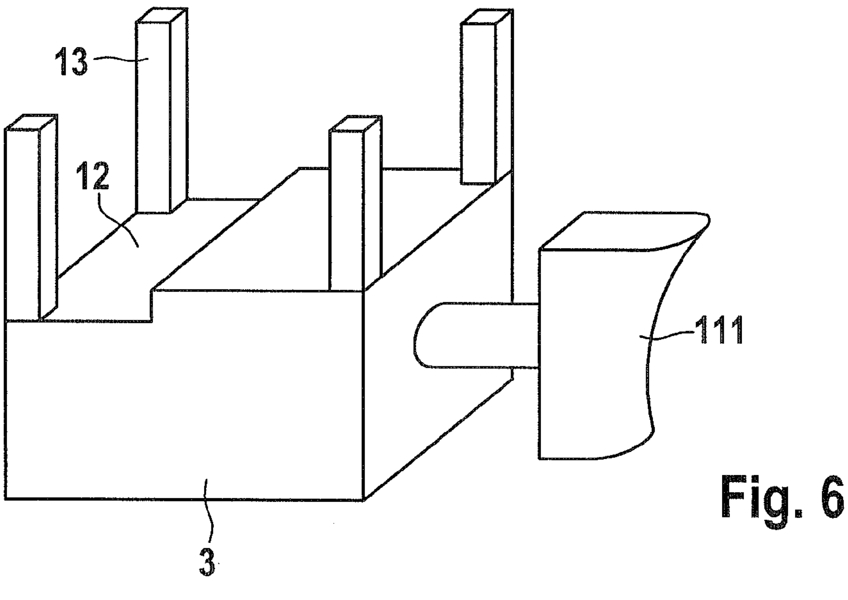

Alternatively, as depicted in FIG. 6, the spacer bolts 13 can also be extrusion-mounted directly onto the switch 3 or its housing 12 and thus constitute an integral component of the switch 3. In this case, the circuit board 5 can be placed directly onto the spacer bolts 13 and mechanically fastened to them. To increase the mechanical rigidity, the spacer bolts 13 can in turn be connected to one another by means of one or more sets of struts 15 (not shown in FIG. 6).

Proposals for mechanically fastening the spacer bolts 13 to the switch 3 and/or circuit board 5 will be explained below in conjunction with FIGS. 7-14.

Figure 7:
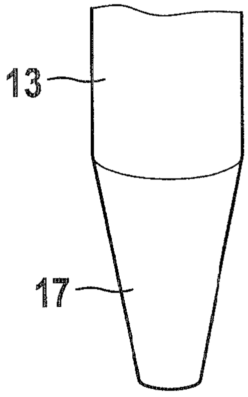

FIG. 7 shows an end section of a cylindrical spacer bolt 13 that is embodied as tapering toward its end in the shape of a cone or a truncated cone. The tip 17 thus formed can be used to more easily find a bore provided in the switch 3 or circuit board 5 and to produce a mechanical press-fit therein. If need be, the press-fit can additionally be ultrasonically welded to further increase mechanical stability.

Figure 8:
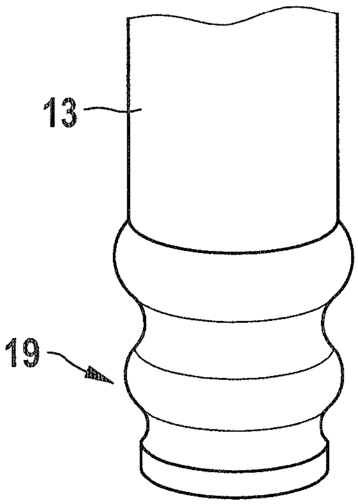

FIG. 8 shows a pin-shaped spacer bolt 13 with a detent bead 19.

Figure 9:
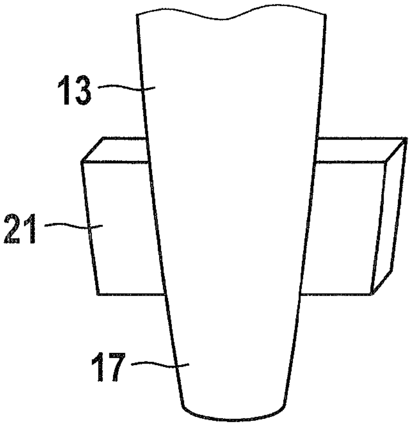
Figure 10:
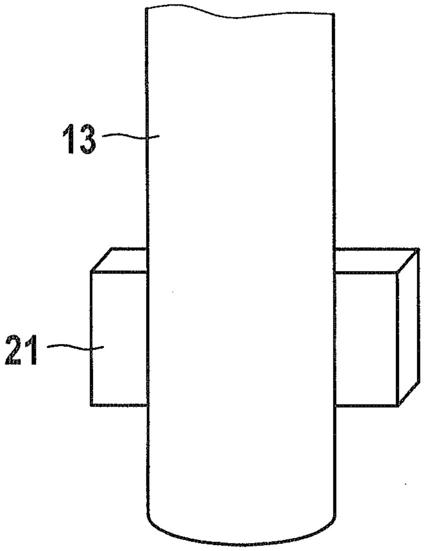

FIGS. 9 and 10 respectively show the spacer bolts 13 with a conically tapering tip 17 and one that is cylindrical, each with deformable ribs 21 embodied on the lateral flanks of the spacer bolt 13.

Figure 11:
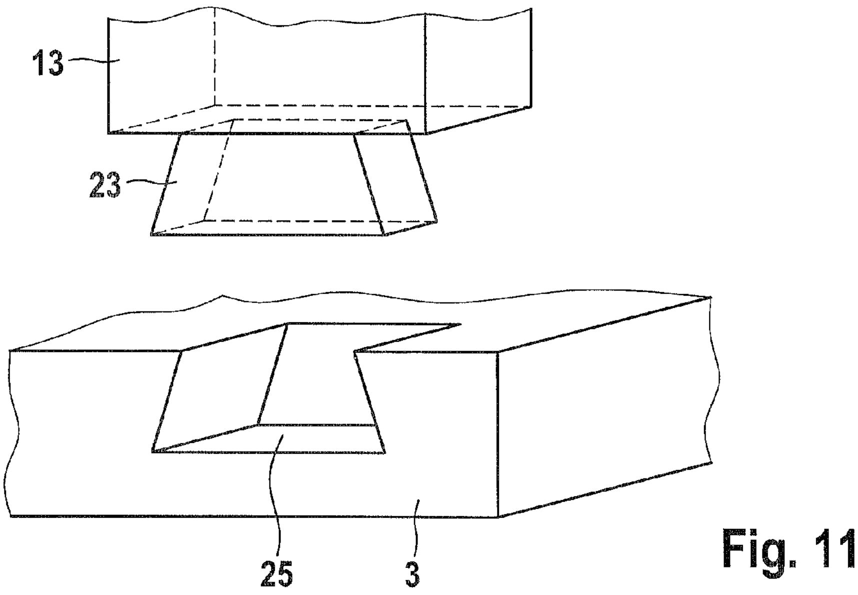

FIG. 11 shows a fastening embodiment in which a dovetail-shaped engaging piece 23 is embodied on the end of a block-shaped spacer bolt 13. A recess 25 complementary thereto is provided in the housing of the switch 3 or in the circuit board 5 and the engaging piece 23 is fitted into this recess in order to fasten the bolt 13 and can, if necessary, be welded and/or glued to it.

Figure 12:
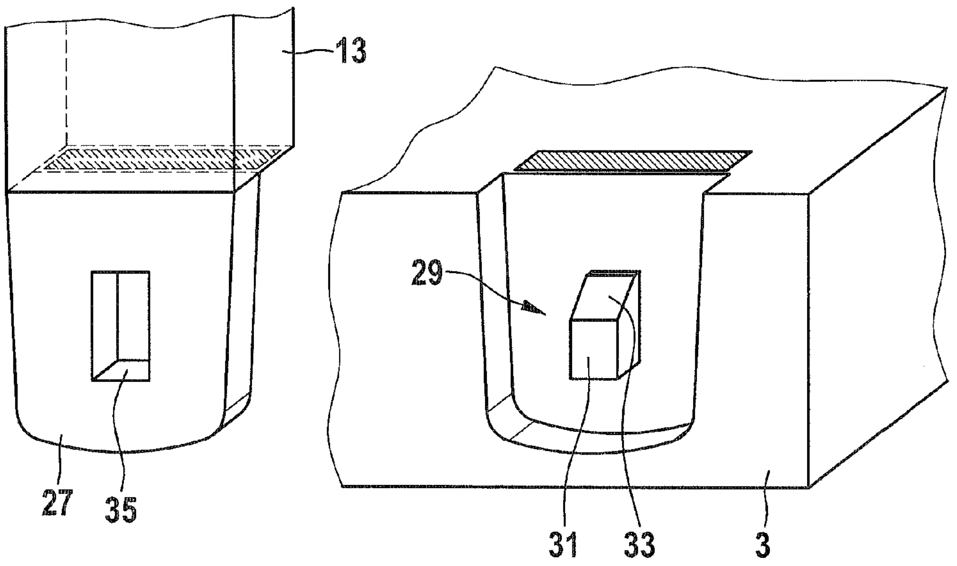

FIG. 12 shows another fastening embodiment in which a detent projection 27 is embodied at the lower end of a spacer bolt 13. The corresponding counterpart element, i.e. the switch 3 or the circuit board 5, is provided with a recess 29 that is complementary thereto, into which a catch hook 31 is formed. The catch hook 31 is embodied so that in the installed state, it engages in a complementary opening 35 in the detent projection 27; the catch hook 31 has a beveled surface 33 that facilitates an insertion of the detent projection 27 into the recess 29 and past the catch hook 31 into the installed position. In the installed state, the spacer bolt 13 is thus supported on the housing of the switch 3 or circuit board 5, which is depicted in the form of a shaded region in the figure.

Figure 13:
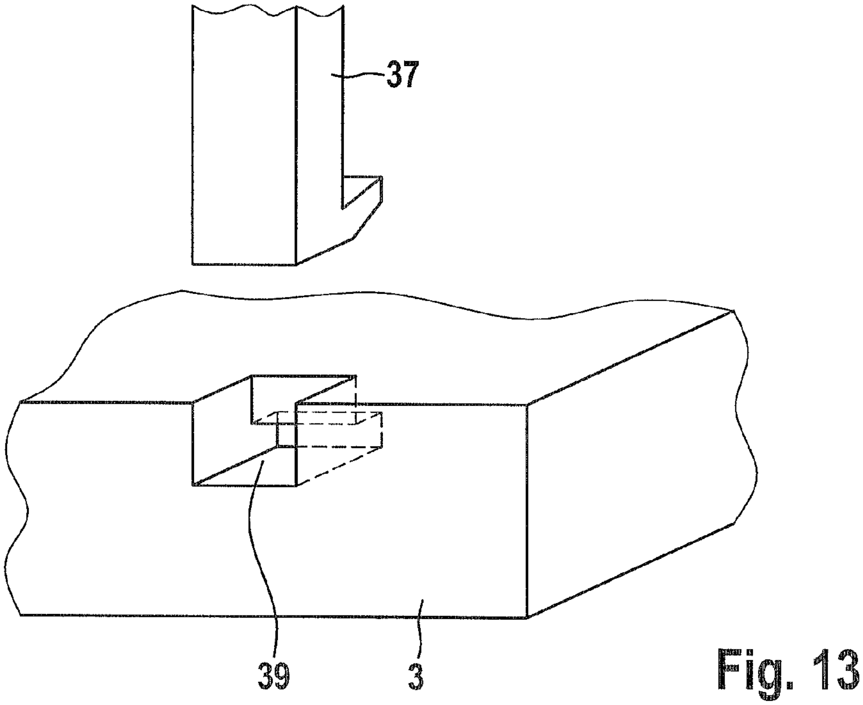
Figure 14:
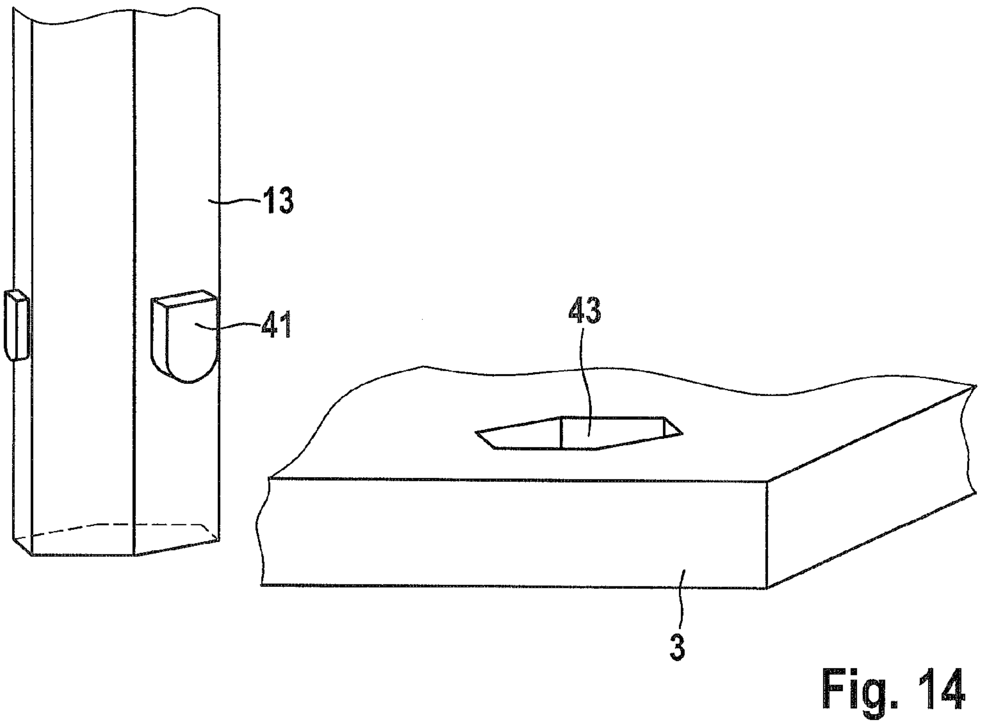

FIGS. 13 and 14 show alternative fastening embodiments in which, as shown in FIG. 13, a catch hook 37, which can be embodied on a spacer bolt not shown, can engage in a pocket 39 embodied in the switch 3 or circuit board 5 or, as shown in FIG. 14, in which a polygonal or round spacer bolt 13 is embodied with detent projections 41 that can engage in detent fashion in complementary recesses 43 in the switch 3 or circuit board 5.

Figure 15:
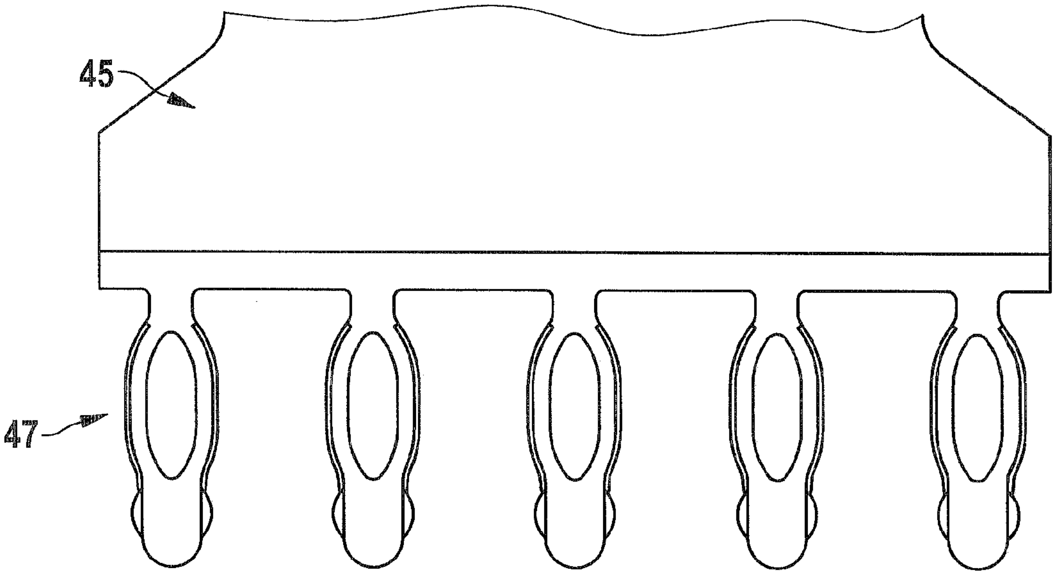
FIG. 15 shows an electrical connecting element in the form of a stamped and bent part, provided for a switch/circuit board unit according to an embodiment of the present invention.

FIG. 15 depicts an electrical connecting element 45 that can be used for producing a mechanically rigid electrical connection between the switch 3 and circuit board 5. The electrical connecting element 45 in this case can be provided on one of the components of the switch/circuit board unit 1, for example the switch 3, and can be affixed to it or embodied as integrally joined to it. To produce a mechanical and electrical connection with the other component of the switch/circuit board unit 1, for example the circuit board 5, the electrical connecting element 45 can be provided with pin-like projections 47. With the aid of the projections 47, the switch 3 and circuit board 5 can be coupled to each other both mechanically and electrically. The rigid connection between the switch 3 and circuit board 5 can prevent the two components from moving relative to each other. This can make it unnecessary to provide a flexible electrical connection with the aid of cables. An embodiment of the electrical connecting element 45 in the form of a stamped and bent part can permit a simple, inexpensive manufacture and a fully automated installation using a plug-in technique, if need be with additional simple soldering points, without requiring adjustment or other aids.

There are several possibilities for connecting the electrical connecting element 45, which is embodied in the form of a stamped and bent part, to the corresponding components of the switch/circuit board unit 1. For example, the pin-like projections 47 can be soldered and/or caulked to the corresponding component. In this case, a plurality of individual pins can be soldered into place using a through-hole technique or an individual pin-like projection 47 with a suitable geometry for a sufficient current-carrying capacity can, for example, be guided through the circuit board 5, caulked, and then soldered. With a suitable design of the stamped and bent part, it is likewise possible to produce an attachment using the SMD technique. In an alternative embodiment, the electrical connecting element 45 can be connected to the corresponding component of the switch/circuit board unit 1 using a so-called press-fit technique. In this case, in order to increase the current-carrying capacity, it is possible to use a single-part or multi-part array with a plurality of pin-like projections 47. In another possible embodiment, the electrical connecting element 45 can be embodied with plugged connections equipped with a spring element and an insertion tab, for example a blade receptacle, a circular socket, etc. in order to thus permit a plugged connection to the corresponding components. Another possible embodiment is a screw connection using known screw-connecting techniques. In this case, a threaded hole can be provided on the side of the stamped and bent part or on the side of the circuit board or switch. Additional components on the circuit board or switch may be required in order to produce the screw connection.

Various embodiments for providing cable supports 9 of the kind that can be embodied for securing flexible cables in the switch/circuit board unit 1 are described below in conjunction with FIGS. 16 through 22.

Figure 16:
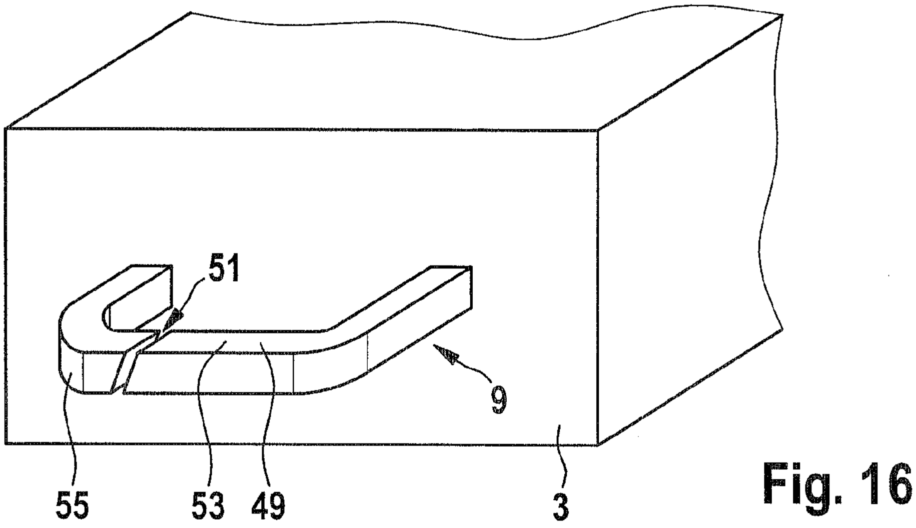
FIGS. 16-22 show embodiments of cable supports for switch/circuit board units according to embodiments of the present invention.

FIG. 16 shows a cable support 9 on a housing of the switch 3 in which the cable support 9 is embodied in the form of a slit bracket 49. The bracket 49 in this case is split by a diagonally extending slit 51. Such an arrangement can preferably be embodied with a long leg 53 and a short leg 55. The long leg 53 can be embodied as a movable by means of its mechanical construction and/or by means of the material used. This permits various lines or cables to be simply and quickly bundled and attached to the switch 3. This makes it unnecessary to insert or thread lines or cables. During servicing or repair, a line or cable can be simply taken back out of the cable support or added to it.

Figure 17:
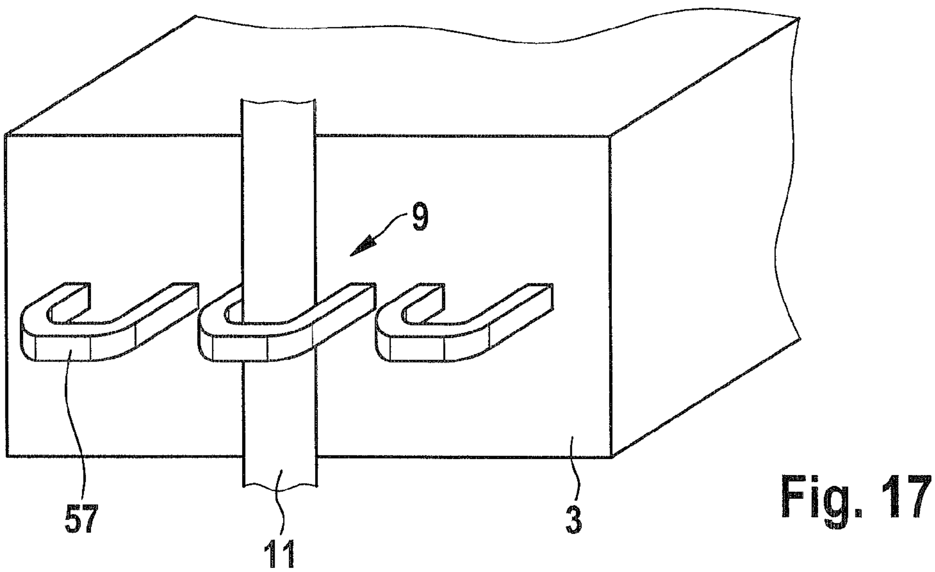

FIG. 17 shows an embodiment in which several individual brackets 57 are embodied on a switch 3. Cables 11 can be individually inserted and affixed to the switch 3. The arrangement precisely determines the position of the cables 11, which can facilitate installation in very cramped spaces. In addition, even when vibrations occur or a drop test is performed, a secure fixing is achieved since it is possible to prevent slippage of cables 11 inside the power tool. Finally, this makes it possible to effectively prevent a defect in the power tool during operation due to scraped, broken lines.

Figure 18:
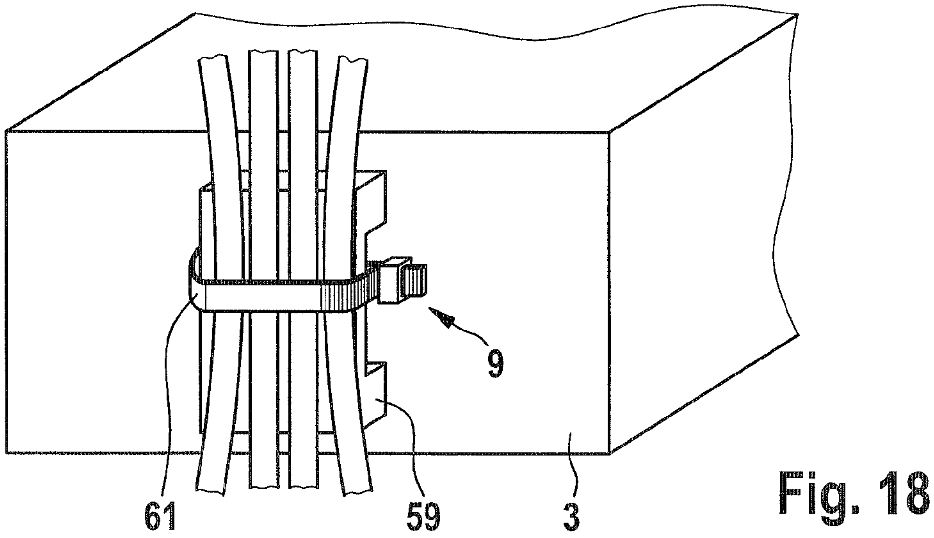

In the embodiment shown in FIG. 18, a cable support 9 includes a bridge-shaped raised area 59 that permits a cable tie 61 to pass through. Another variant of the bridge-like raised area 59 is embodied in the form of a bracket that is molded onto the switch housing on only one side, e.g. at the top or bottom. In a first work step, the cables can be bundled with the cable tie 61 and then fixed in place. Then the cable tie 61 can be hooked onto the bracket. This allows the cable bundle to be unhooked from the bracket and hooked onto it again without having to undo the bundle.

Figure 19:
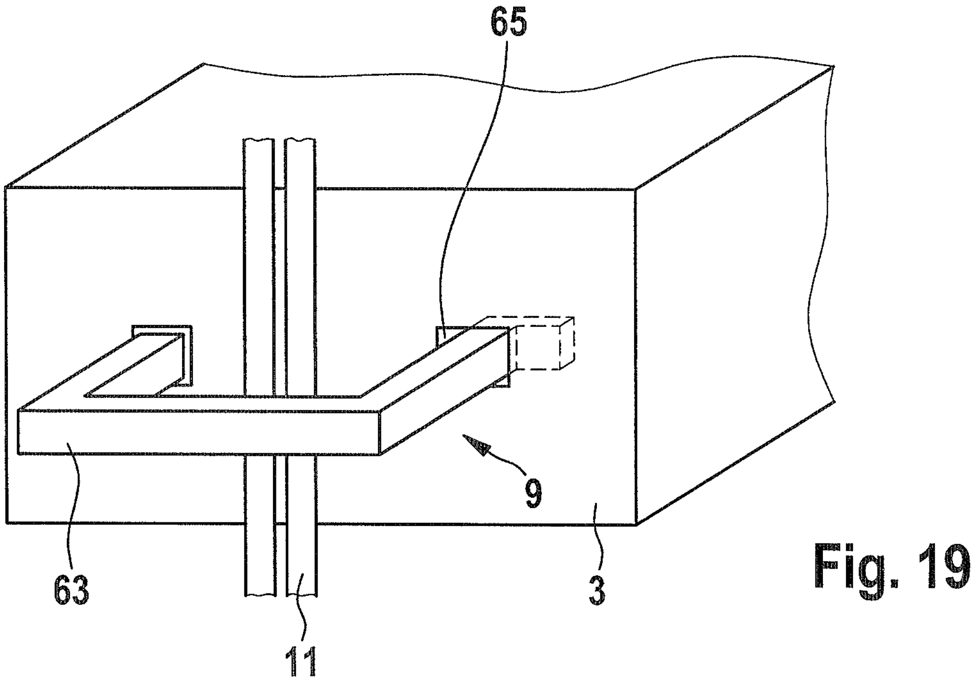
Figure 20:
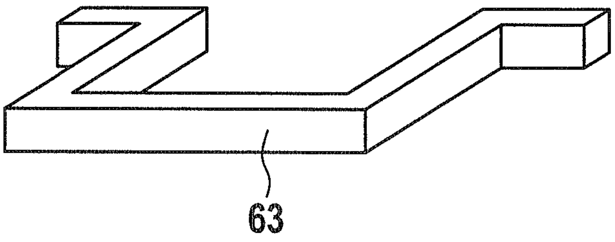
Figure 21:
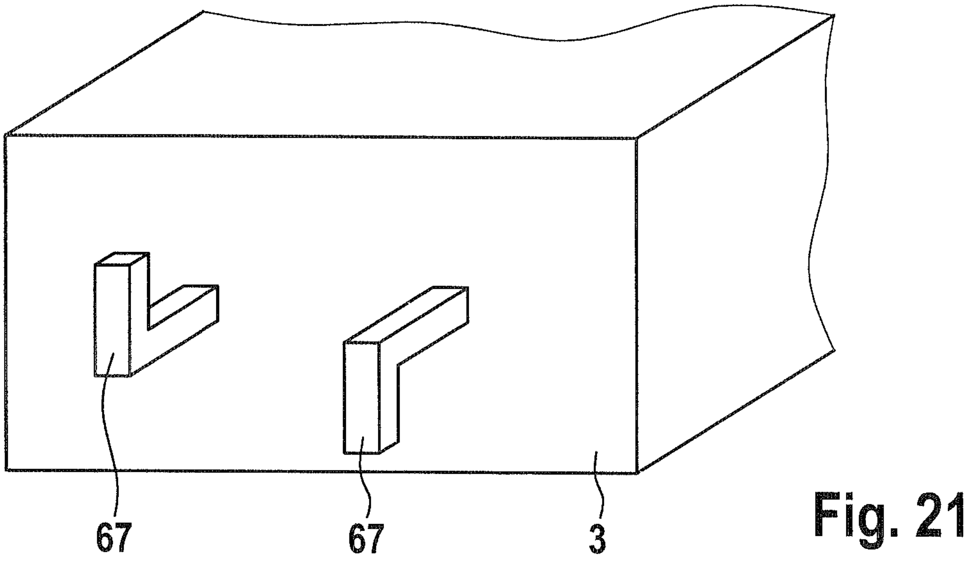

In the embodiment of a cable support 9 shown in FIGS. 19 and 20, a so-called detent bracket 63 can be used that is embodied, for example, in the form of a separate U-shaped bracket with ends bent outward at right angles. This separate detent bracket can be secured in a pocket 65 in the housing of the switch 3. An elastic property causes the bracket 63 to press outward and engage in the detent pockets 65, as schematically depicted for the right side in FIG. 19. When service or repair work is required, the attachment can be easily released and produced again. As a variant, the bracket 63 can engage in detent fashion not in the switch housing, but in two detent projections 67, as is schematically depicted in FIG. 21. The detent projections can be oriented in the same direction or in opposite directions from each other.

Figure 22:
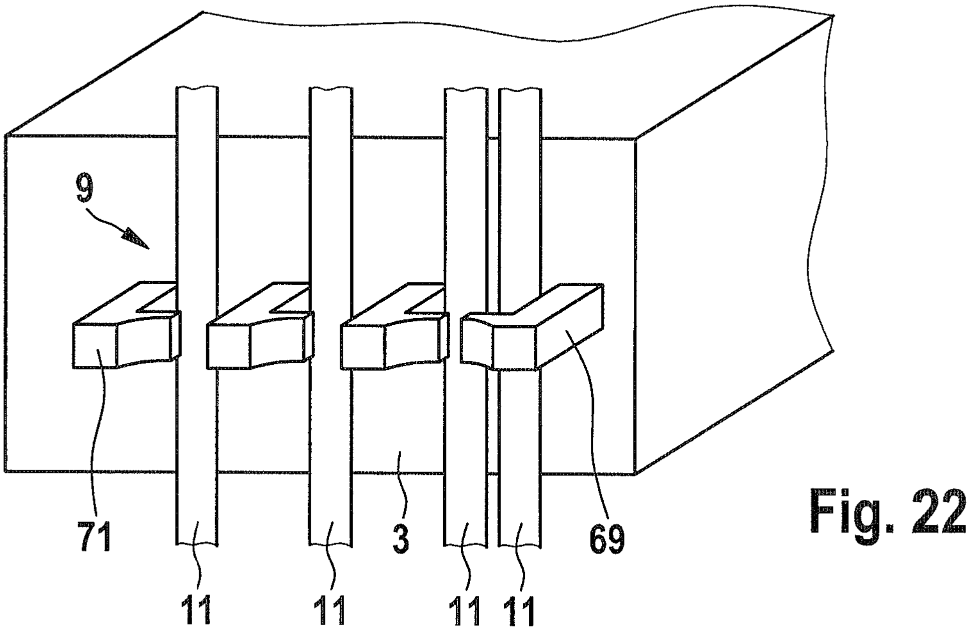

FIG. 22 depicts another alternative embodiment of a cable support 9. In this case, cables 11 are secured with the aid of a so-called cable comb 69. The cable comb can be embodied with a kind of detent engagement, for example with the aid of a detent projection 71. This can prevent the cable 11 from sliding out due to vibrations or powerful agitations. The cable comb 69 and detent projections 71 can be embodied in any desired shape. A multiple detent engagement can increase reliability. It is thus possible to securely fix two cables in one slot. The detent projections 71 can be embodied on one side or on both sides of a tine of a cable comb 69.

The foregoing relates to preferred exemplary embodiments of the invention, it being understood that other variants and embodiments thereof are possible within the spirit and scope of the invention, the latter being defined by the appended claims.

We claim:

1. A power tool comprising:

a switch having a switch housing enclosing the switch; a circuit board; and at least one mechanical coupling element embodied in the form of spacer bolts for producing a rigid mechanical coupling between the switch and circuit board, the switch housing being directly connected to the circuit board in a mechanically rigid fashion by means of the spacer bolts, the spacer bolts being positioned between the switch and the circuit board, such that a first end of the spaced bolts is on an outside of the switch housing facing the circuit board and is attached to an exterior of the switch housing and a second end of the spacer bolts is attached to the circuit board, wherein a space is provided between the exterior of the switch housing and the circuit board by the presence of the spacer bolts therebetween, wherein the switch housing has a geometry which is adapted to an ergonomic shape of a handle of the power tool by means of deviations from a block shape, wherein the deviations include beveling of edges of the block; and at least one flexible cable for producing an electrical connection between the switch and circuit board, and at least one cable support situated on the switch and/or the coupling element and/or the circuit board.

2. The power tool as recited in claim 1, wherein the coupling element is provided in the form of at least one separate component that is fastened to the switch housing and to the circuit board in a form-locked or integral fashion.

3. The power tool as recited in claim 1, wherein the coupling element is embodied of one piece with the housing of the switch or is embodied of one piece with the circuit board.

4. The power tool as recited in claim 1, further comprising an electrical connecting element for producing a mechanically rigid electrical connection between the switch and the circuit board.

5. The power tool as recited in claim 1, further comprising an electrical connecting element for producing a mechanically rigid electrical connection between the switch and the circuit board.

6. A hand-held tool equipped with the power tool as recited in claim 1.

7. The power tool as recited in claim 1, further comprising struts that connect the spacer bolts firmly to one another.

8. The power tool as recited in claim 1, wherein the spacer bolts are inserted into bores provided in either the circuit board and/or the switch.

9. The power tool as recited in claim 1, wherein the spaced bolts do not pass through the switch housing.

10. The power tool as recited in claim 1, wherein the switch does not adjoin the circuit board.

11. The power tool as recited in claim 1, wherein the switch housing does not adjoin the circuit board.

12. The power tool as recited in claim 1, wherein the power tool is a cordless screwdriver.

13. The power tool as recited in claim 2, wherein the coupling element is embodied of one piece with the housing of the switch or is embodied of one piece with the circuit board.

14. The power tool as recited in claim 2, further comprising at least one flexible cable for producing an electrical connection between the switch and circuit board, and at least one cable support situated on the switch and/or the coupling element and/or the circuit board.

15. The power tool as recited in claim 2, further comprising an electrical connecting element for producing a mechanically rigid electrical connection between the switch and the circuit board.

16. The power tool as recited in claim 3, further comprising at least one flexible cable for producing an electrical connection between the switch and circuit board, and at least one cable support situated on the switch and/or the coupling element and/or the circuit board.

17. The power tool as recited in claim 3, further comprising an electrical connecting element for producing a mechanically rigid electrical connection between the switch and the circuit board.

18. The power tool as recited in claim 4, wherein the connecting element is embodied as a stamped and bent part.

19. The power tool as recited in claim 4, wherein the connecting element is joined to the switch and/or the circuit board in a form-locked or integral fashion.

20. The power tool as recited in claim 5, wherein the connecting element is embodied as a stamped and bent part.

21. The hand-held tool as recited in claim 6, wherein the hand-held tool has a tool housing and either only the switch or only the circuit board is mechanically fastened directly to the tool housing.

22. The power tool as recited in claim 13, further comprising at least one flexible cable for producing an electrical connection between the switch and circuit board, and at least one cable support situated on the switch and/or the coupling element and/or the circuit board.

23. The power tool as recited in claim 18, wherein the connecting element is joined to the switch and/or the circuit board in a form-locked or integral fashion.

24. The power tool as recited in claim 20, wherein the connecting element is joined to the switch and/or the circuit board in a form-locked or integral fashion.

25. A power tool comprising:

a switch having a switch housing enclosing the switch; a circuit board; at least one mechanical coupling element for producing a rigid mechanical coupling between the switch and circuit board, the switch housing being directly connected to the circuit board in a mechanically rigid fashion by means of the at least one mechanical coupling element, the at least one mechanical coupling element does not pass through the switch housing, the at least one mechanical coupling element being positioned between the switch and the circuit board, such that a first end of the at least one mechanical coupling element is on an outside of the switch housing facing the circuit board and is attached to an exterior of the switch housing and a second end of the at least one mechanical coupling element is attached to the circuit board, wherein a space is provided between the exterior of the switch housing and the circuit board by the presence of the at least one mechanical coupling element therebetween; at least one flexible cable for producing an electrical connection between the switch and circuit board; and at least one cable support situated on the switch housing which protrudes in a stirrup shape on the switch housing, wherein the switch housing has a geometry which is adapted to an ergonomic shape of a handle of the power tool by means of deviations from a block shape, wherein the deviations include beveling of edges of the block.

26. The power tool as recited in claim 25, wherein the cable support is configured to affix a plurality of cables.

27. The power tool as recited in claim 25, wherein the cable support comprises several brackets being configured to individually insert and affix cables.

28. The power tool as recited in claim 25, wherein the cable support is configured to be opened and closed to permit initial insertion of at least one cable, subsequent addition of at least one cable, or removal of at least one cable.

29. The power tool as recited in claim 25, wherein the cable support is in the shape of a bracket.

30. The power tool as recited in claim 25, wherein the cable support comprises a bridge-shaped raised area that permits a cable tie to pass through.

31. The power tool as recited in claim 25, wherein the cable support comprises a cable comb.

32. The power tool as recited in claim 29, wherein the bracket is configured as a slit bracket.

33. The power tool as recited in claim 29, wherein the bracket is configured as an elastic detent bracket which is secured in a pocket in the switch housing.

* * * * *